United States Patent
Chung et al.

(10) Patent No.: US 10,289,139 B1
(45) Date of Patent: May 14, 2019

(54) POWER CIRCUIT AND ITS OPERATION METHOD FOR REGULATING POWER TRANSFER

(71) Applicant: City University of Hong Kong, Kowloon (HK)

(72) Inventors: Shu Hung Henry Chung, Mid-Levels (HK); Kuen Faat Yuen, New Territories (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/049,940

(22) Filed: Jul. 31, 2018

(51) Int. Cl.
| G05F 5/00 | (2006.01) |
| G05F 1/56 | (2006.01) |
| H03H 11/04 | (2006.01) |
| G05F 1/565 | (2006.01) |

(52) U.S. Cl.
CPC .............. G05F 1/56 (2013.01); H03H 11/04 (2013.01)

(58) Field of Classification Search
CPC .. G05F 5/00; G05F 1/56; G05F 1/565; H02M 2001/0022; H02M 2001/0045; H02M 2001/0067; H02M 3/158
See application file for complete search history.

(56) References Cited

U.S. PATENT DOCUMENTS

| 5,592,072 A * | 1/1997 | Brown ..................... G05F 1/62 323/268 |
| 9,531,270 B2 * | 12/2016 | Shi ........................ H02J 7/0068 |
| 9,698,672 B2 | 7/2017 | Chung |
| 2007/0114981 A1 * | 5/2007 | Vasquez ................ H02M 3/158 323/266 |
| 2015/0362933 A1 | 12/2015 | Chung et al. |
| 2015/0364989 A1 | 12/2015 | Chung et al. |

* cited by examiner

Primary Examiner — Gary L Laxton
(74) Attorney, Agent, or Firm — Renner, Kenner, Greive, Bobak, Taylor & Weber

(57) ABSTRACT

A power circuit for regulating power transfer includes: a power converter circuit having an input and an output and arranged to be connected between a power supply and a load to regulate power transfer therebetween; an input capacitor connected across the input of the power converter circuit; a series pass element arranged to be connected between the power supply and the input capacitor; and a control circuit, operably connected with the series pass element and the power converter circuit, for controlling operation of the series pass element. The power circuit further includes an input capacitor power control circuit operably connected with the input capacitor and arranged to provide power to the input capacitor to facilitate charging of the input capacitor when a voltage across the series pass element is detected to be above a voltage threshold as a result of an increase in a voltage of the power supply.

20 Claims, 3 Drawing Sheets

POWER CIRCUIT AND ITS OPERATION METHOD FOR REGULATING POWER TRANSFER

TECHNICAL FIELD

The invention relates to a power circuit for regulating power transfer between a power supply and a load. The invention also relates to a method of operation of such power circuit.

BACKGROUND

Power electronics, as an enabling technology, enhances functionality and performance of electrical systems through effective and efficient utilization of electrical energy. The main aims of power converter circuits are to control, convert, and condition electrical power flow from one form to another through the use of solid-state electronics. The power level in these systems ranges from less than one watt in wireless inductive link for biomedical implants to tens, hundreds, or thousands of watts in power supplies for office equipment and to kilowatts or megawatts in power flow controller for electric power transmission.

A power converter circuit generally comprises three main parts: an input filter, a high-frequency switching network, and an output filter. The switching network is the core power processing unit that manipulates power from available source into desired electrical output form for the load, with low power dissipations in the power semiconductor switching devices. The input filter is used to prevent unwanted radiated or conducted noise, generated by the switching network, from getting into the source, and to ensure compliance with regulatory electromagnetic compatibility standards. The output filter is used to pass wanted electrical output form and attenuate unwanted noise to the load. Both the input filter and the output filter can be made using passive components, such as resistors, capacitors, and inductors.

Popular forms of such filters include second-order inductor-capacitor and third-order inductor-capacitor-inductor. These filters provide good attenuation of switching harmonics with small filter components. In principle, the physical size of the filter decreases with an increase in the system order. It is thus an attractive strategy to use high-order filters to increase the system power density, energy efficiency and dynamic response. However, high-order filters exhibit multiple resonant frequencies that would cause unwanted oscillation. A remedial measure to alleviate this problem is to introduce either passive or active damping into the system. Passive damping is simple in structure but introduces system losses; active damping does not introduce additional losses but results in a more complex control system and limited bandwidth.

In practice, switching devices and passive components are not-ideal (i.e., not lossless). Major power losses in the system is usually in the conduction and switching losses of the switching network, and the ohmic and magnetic core losses of the filters.

Although recent advances in new and emerging materials, device technologies, and network topologies have resulted in reducing the losses of switching devices and increasing the operating frequency for reducing the filter size, the filter sections still occupy considerable space and constitute a major part of the total power loss. For example, the total volume occupied by the input and output filter sections in a power factor pre-regulator or static synchronous series compensator could range from 20% to 30% of the total volume. The total power dissipation of power filters can range from 2% to 5% of the power processed by the system.

The ever-increasing density of power converter circuits is straining engineers' and designers' abilities to squeeze space for the filters without sacrificing performance.

In particular, thermal management and electromagnetic couplings among different components within a limited space poses significant challenges to engineers and designers. Yet, there has been no significant enhancement and development in the filter structure and design in today's power converter circuits. Thus, the filter section remains a key limiting factor in advancing the power density and performance of the power converter circuits.

Recently, a new concept for performing input filtering (as a direct substitute for passive filters) in power converter circuits has been proposed. US20150364991A, US20150362933A and US20150364989A show some exemplary systems that incorporate this new concept. Basically, in this concept, a series pass element is used to profile the current drawn from the power supply and an input capacitor is arranged at the input of the power converter circuit to absorb the high-frequency current generated by the power converter circuit. The voltage across the series pass element is regulated by controlling the input voltage of the power converter circuit through adjusting the switching frequency and duty cycle of the power switches in the power converter circuit. In these types of systems, when the input current is small and the voltage of the power supply suddenly increases, the input capacitor cannot be charged up to the required voltage level quickly through the supply current (even if the power converter circuit does not draw any current), and so the input voltage of the power converter circuit is unable to closely follow the sudden change in the voltage of the power supply. As a result, a significant voltage stress (increase) will be applied across the series pass element. Such voltage stress may adversely affect the operation life and performance of the series pass element.

SUMMARY OF THE INVENTION

It is an object of the invention to address the above needs, to overcome or substantially ameliorate the above disadvantages or, more generally, to provide an improved power circuit.

In accordance with a first aspect of the invention, there is provided a power circuit for regulating power transfer, the power circuit comprising: a power converter circuit arranged to be connected between a power supply and a load to regulate power transfer therebetween, the power converter circuit having an input and an output; an input capacitor connected across the input of the power converter circuit; a series pass element arranged to be connected between the power supply and the input capacitor; and a control circuit, operably connected with the series pass element and the power converter circuit, for controlling operation of the series pass element; wherein the power circuit further comprises an input capacitor power control circuit operably connected with the input capacitor, the input capacitor power control circuit is arranged to provide power to the input capacitor to facilitate charging of the input capacitor when a voltage across the series pass element is detected to be above a voltage threshold as a result of an increase, in particular a sudden increase, in a voltage of the power supply.

In one embodiment of the first aspect, the charging of the input capacitor increases the voltage across the input capacitor and reduces the voltage across the series pass element.

In one embodiment of the first aspect, the power circuit further includes a voltage control circuit for detecting a voltage across the series pass element and for comparing the detected voltage with the voltage threshold.

The voltage control circuit may be part of the control circuit. Preferably, the power converter circuit comprises one or more power switches; and the voltage control circuit is further arranged to control operation of the one or more power switches based on the comparison. Preferably, the control circuit further comprises a current control circuit connected between the series pass element and the power converter circuit, the current control circuit is arranged to detect an output of the power converter circuit or an operation parameter of the power converter circuit and, based on the detection, control a current supplied to the series pass element.

Preferably, the input capacitor power control circuit is a bi-directional circuit, which is further operable to discharge the input capacitor.

Preferably, the input capacitor power control circuit comprises a supplementary power converter circuit operably connected with a power source. The supplementary power converter circuit may comprise one or more power switches. The power source may be provided, for example, by the output of the power converter circuit, or by a separate capacitor.

In one embodiment of the first aspect, the voltage threshold is predetermined. In another embodiment of the first aspect, the voltage threshold is dynamically adjustable.

Preferably, the series pass element comprises a transistor. For example, the series pass element may include a bipolar junction transistor. In one embodiment of the first aspect, the control circuit is arranged to control the transistor to operate in a linear region.

Preferably, the input capacitor and the series pass element forms an input filter for the power converter circuit.

In one embodiment of the first aspect, the input capacitor power control circuit is arranged to provide power to the input capacitor to facilitate charging of the input capacitor until a voltage across the input capacitor substantially equals to a difference between a voltage of the power supply and the voltage threshold.

Optionally, the power converter circuit is a bi-directional converter circuit.

In accordance with a second aspect of the invention, there is provided a method for operating the power circuit of the first aspect, the method comprising: detecting a voltage across the series pass element; determining whether the detected voltage is above a voltage threshold; and providing power to the input capacitor to charge the input capacitor when the detected voltage is determined to be above the voltage threshold.

Preferably, the step of providing power to the input capacitor stops when a voltage across the input capacitor substantially equals to a difference between the voltage of the power supply and the voltage threshold.

In accordance with a third aspect of the invention, there is provided an electrical device comprising the power circuit of the first aspect.

BRIEF DESCRIPTION OF THE DRAWINGS

Embodiments of the invention will now be described, by way of example, with reference to the accompanying drawings in which.

DETAILED DESCRIPTION

Figure 1:
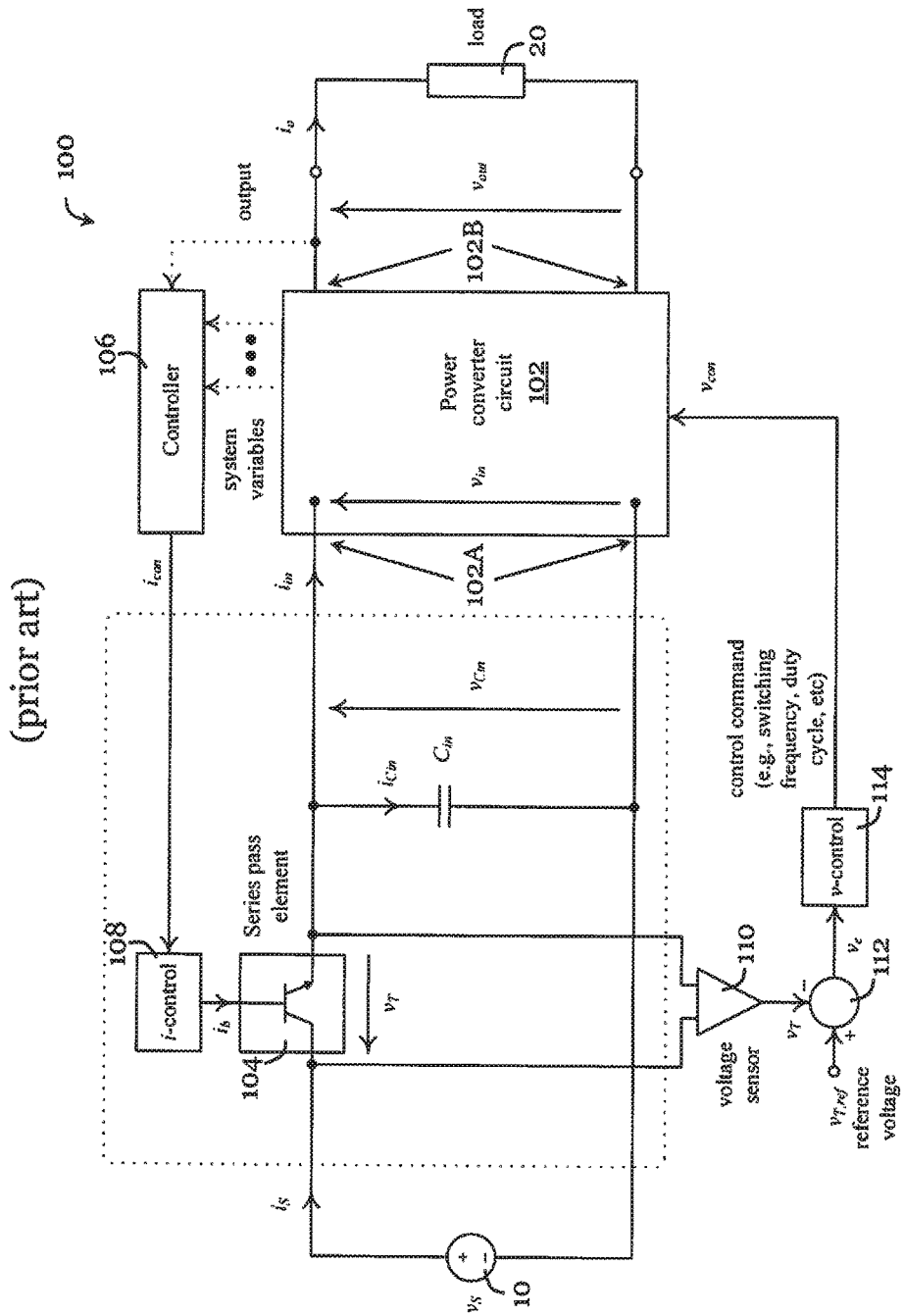
FIG. 1 is a schematic circuit diagram illustrating an existing power circuit for regulating power transfer between a power supply and a load.

FIG. 1 shows an existing power circuit too for regulating power transfer between a power supply to and a load 20. The power circuit 100 includes a power converter circuit 102 arranged between the power supply to with a voltage $v_s$ and the load 20 to regulate power transfer between them. The power converter circuit 102 includes one or more power switches (not shown), as well as an input 102A with an input voltage $v_{in}$ and an output 102B with an output voltage of $v_{out}$. An input capacitor $C_{in}$ is connected across the input 102A of the power converter circuit 102. The input capacitor $C_{in}$ acts as a buffer for absorbing the difference between the supply current $i_s$ and the input current $i_{in}$ to the power converter circuit. A series pass element 104 is connected between the power supply 10 and the input capacitor $C_{in}$. The series pass element 104 is used to profile the current drawn from the power supply 10. In this embodiment, the series pass element 104 is a bipolar junction transistor connected in series with the power supply 10 and the input capacitor $C_{in}$. The power circuit 100 also includes a control circuit connected with the series pass element 104 and the power converter circuit 102 for controlling operation of the series pass element 104. In this embodiment, the control circuit is arranged to regulate the operating point of the series pass element 104 to be at the boundary between the active region and the saturation region. The control circuit includes a current control circuit and a voltage control circuit, each connecting between the series pass element 104 and the power converter circuit 102. The current control circuit includes a controller 106 arranged to detect one or more of an output $v_{out}$ of the power converter circuit 102 and operation parameter(s) of the power converter circuit 102, and a further controller 108 connected between the controller 106 and the series pass element 104. The further controller 108 is arranged to receive a control current $i_{con}$ outputted by the controller 106 and, based on the received control current $i_{con}$, provides an output current $i_b$ to the series pass element 104 for controlling operation parameters of the series pass element 104. The operation parameters include a voltage $v_T$ across the series pass element 104 or a current through the series pass element 104 (same as the supply current $i_s$ provided from the power supply 10 to the power converter circuit 102). The voltage control circuit includes a voltage detector 110 arranged to detect a voltage $v_T$ across the series pass element 104, a comparator 112 arranged to compare the detected voltage $v_T$ with a reference voltage value or threshold $v_{T,ref}$, and a controller 114 arranged to control operation (e.g., duty cycle, switching frequency, etc.) of one or more switches in the power converter circuit 102 based on the comparison (e.g., an error voltage $v_e$ indicative of the difference between the detected voltage $v_T$ and the reference voltage value $v_{T,ref}$). Specifically, the output $v_{con}$ of the controller 114 is used to control the input voltage $v_{in}$ of the power converter circuit 102. In this embodiment, the reference voltage $v_{T,ref}$ is set at a value slightly higher than the saturation voltage (less than 1V) of the series pass element 104, so as to reduce the power dissipation in the series pass element 104.

Using the power circuit 100 of FIG. 1, the supply current $i_s$ has a low noise and the power dissipation of the series pass element 104 is kept low. As shown in FIG. 1, the current $i_{Cin}$ of the input capacitor $C_{in}$ is equal to the difference between the supply current $i_s$ and the input current $i_{in}$ to the power converter circuit 102. In other words, $$i_{Cin} = i_s - i_{in} \quad (1)$$

When the supply current $i_s$, which is also the current through the series pass element 104, is controlled to be substantially ripple-free, the high-frequency current generated by the power converter circuit 102 goes to the input capacitor $C_{in}$.

Problematically, however, in the circuit 100 of FIG. 1, when the required supply current $i_s$ is small and the supply voltage $\upsilon_s$ increases, in particular suddenly increases, the voltage across the input capacitor $C_{in}$ cannot be increased quickly owing to its inherent properties.

In one extreme example, when the input current $i_{in}$ to the power converter circuit 102 becomes close to zero, substantially all of the supply current $i_s$ goes to the input capacitor $C_{in}$. The voltage across the input capacitor $C_{in}$ can be expressed as $$v_{Cin}(t) = \frac{1}{C_{in}} \int_0^t i_s(\tau) d\tau + V_{Cin}(0) \quad (2)$$

where $\upsilon_{Cin}$ is the voltage across the input capacitor $C_{in}$ and $\upsilon_{Cin}(o)$ is the initial voltage of the input capacitor $C_{in}$. It should be noted that in this embodiment the voltage $\upsilon_{Cin}$ across the input capacitor $C_{in}$ equals to the input voltage $\upsilon_{in}$ of the power converter circuit 102. Also, the voltage $\upsilon_T$ across the series pass element 104 equals to the difference between the supply voltage $\upsilon_s$ and the voltage $\upsilon_{Cin}$ across the input capacitor $C_{in}$, that is:

$$\upsilon_T = \upsilon_s - \upsilon_{Cin} \quad (3)$$

Thus, if the supply voltage $\upsilon_s$ increases and $\upsilon_{Cin}$ does not respond quickly enough, the voltage $\upsilon_T$ across the series pass element 104 will increase. As a result, extra voltage stress will be applied to the series pass element 104. According to Equation (2), the situation would become worse when the supply current $i_s$ is small.

Figure 2:
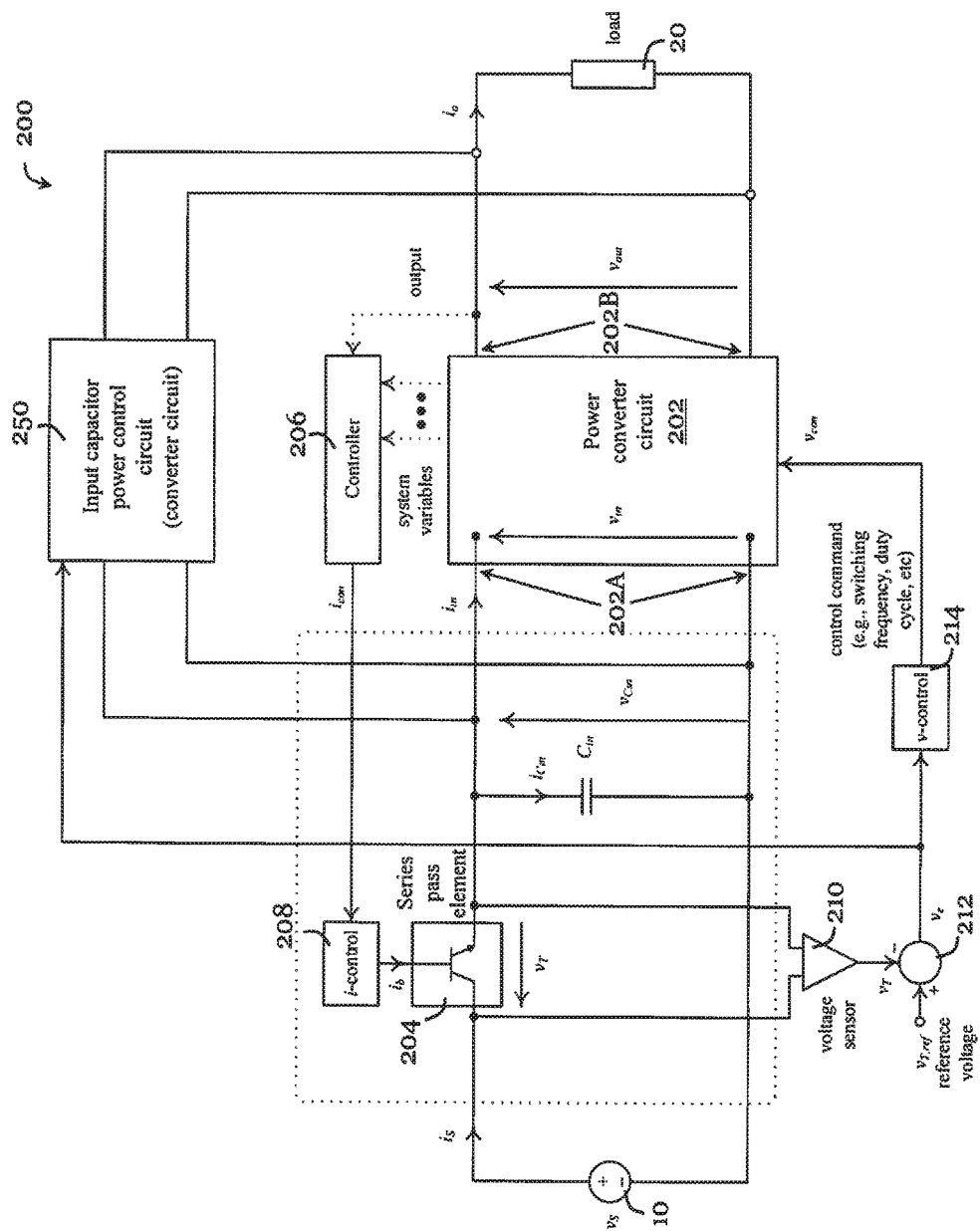
FIG. 2 is a schematic circuit diagram of a power circuit in one embodiment of the invention.

FIG. 2 shows a power circuit 200 in one embodiment of the invention. The construction of the power circuit 200 in FIG. 2 is similar to the circuit 100 in FIG. 1 (like components will be numbered using the reference numbers of FIG. 1 plus 100). Only their differences will be described below.

In the power circuit 200 of FIG. 2, an input capacitor power control circuit 250 is connected between the input capacitor $C_{in}$ and the output 202B of the power converter circuit 202. More specifically, the input capacitor power control circuit 250 is connected across the input capacitor $C_{in}$ and across the 202B of the power converter circuit 202. The input capacitor power control circuit 250 is arranged to control a voltage $\upsilon_{Cin}$ across input capacitor $C_{in}$ based on a detected voltage across the series pass element 204. In this embodiment, the input capacitor power control circuit 250 is arranged to provide power to the input capacitor $C_{in}$ to facilitate charging of the input capacitor $C_{in}$ when a voltage across the series pass element 204 is detected to be above a voltage threshold as a result of an increase in a voltage of the power supply 10. In this example, the detection is performed by the voltage control circuit, and the voltage control circuit provides a corresponding input to the input capacitor power control circuit 250 based on the detection. In this embodiment, the input capacitor power control circuit 250 includes one or more power switches.

In one example, the input capacitor power control circuit 250 is arranged to control the voltage $\upsilon_{Cin}$ across input capacitor $C_{in}$ such that it substantially follows the waveform of voltage $\upsilon_s$ of the power supply to with a difference equals to the reference voltage $\upsilon_{T,ref}$. This arrangement effectively reduces voltage stress on the series pass element 204 during operation.

In operation, when the difference between the voltage $\upsilon_T$ across the series pass element 204 is higher or significantly higher than $\upsilon_{T,ref}$ i.e., above a voltage threshold, as detected by the voltage control circuit, the input capacitor power control circuit 250 receives a corresponding signal from the voltage control circuit. The input capacitor power control circuit 250, in particular its switch(es), will then be controlled to transfer energy from the output 202B of the power converter circuit 202 through the input capacitor power control circuit 250 to the input capacitor $C_{in}$ to facilitate charging up of the input capacitor $C_{in}$. As a result, the voltage $\upsilon_{Cin}$ across the input capacitor $C_{in}$ will increase and the voltage $\upsilon_T$ across the series pass element will decrease.

In this embodiment, the input capacitor power control circuit 250 is further arranged to discharge the input capacitor $C_{in}$ by transferring energy from the input capacitor $C_{in}$ to the output 202B of the power converter circuit 202. This discharge may occur when the voltage $\upsilon_T$ across the series pass element 204 is detected to be below a recovery threshold.

Figure 3:
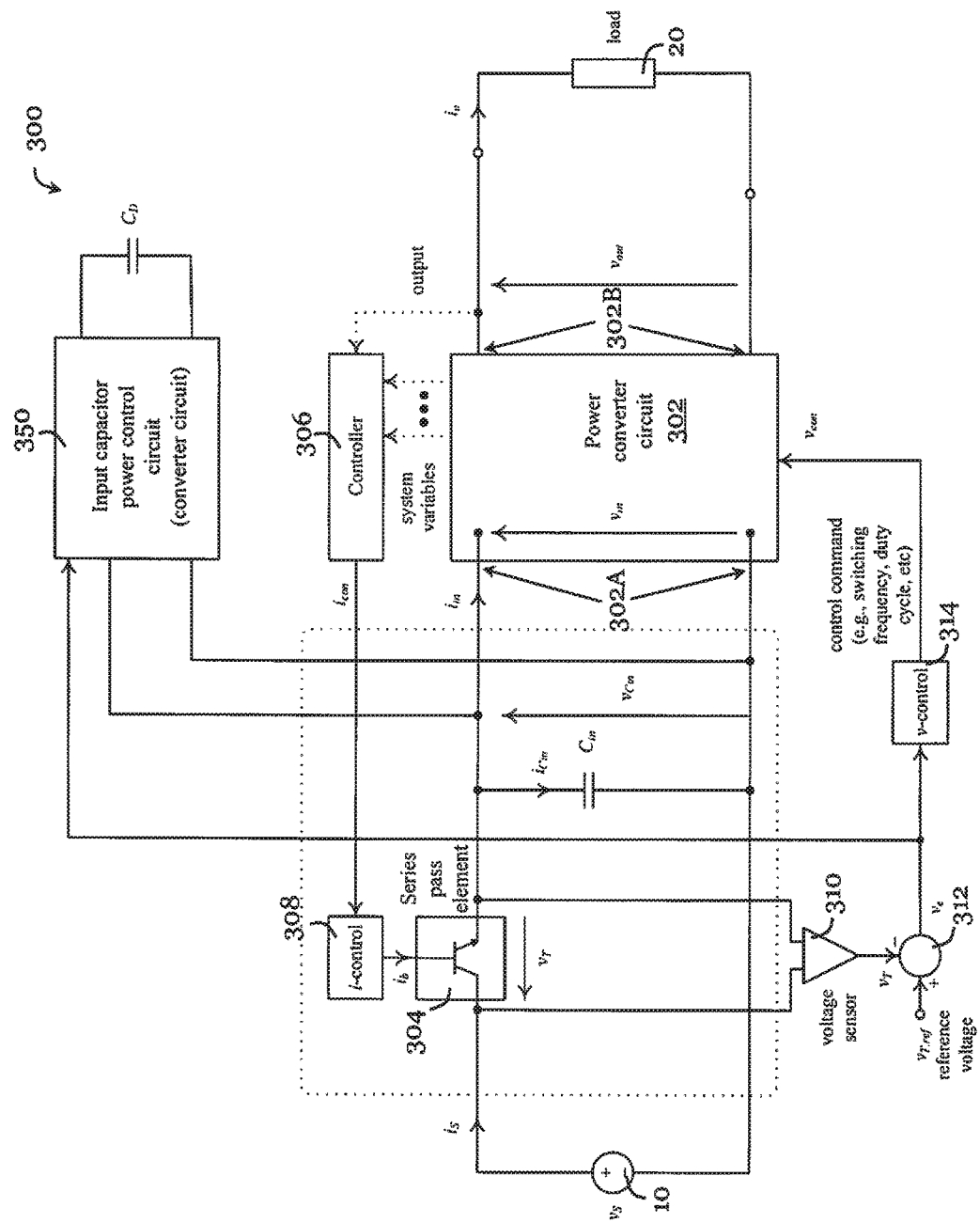
FIG. 3 is a schematic circuit diagram of a power circuit in another embodiment of the invention.

FIG. 3 shows a power circuit in another embodiment of the invention. The construction of the power circuit in FIG. 3 is similar to the power circuit in FIG. 2 (like components will be numbered using the reference numbers of FIG. 2 plus 100). The only difference is that the input capacitor power control circuit 350 is not connected with the output 302B of the power converter circuit 302, but with a separate capacitor $C_D$. The voltage across capacitor $C_D$ can be regulated by transferring energy to and from the input capacitor $C_{in}$, affecting the voltage $\upsilon_{Cin}$ across the input capacitor $C_{in}$ or the input voltage $\upsilon_{in}$ to the power converter circuit. Similar to the circuit 200 in FIG. 2, the input capacitor power control circuit 350 in FIG. 3 will transfer energy to the input capacitor $C_{in}$ to facilitate charging of the input capacitor $C_{in}$ when it is detected that the voltage $\upsilon_T$ across the series pass element 304 is above a voltage threshold.

The above embodiments of the invention have provided a power circuit that can speed up the charging of the input capacitor $C_{in}$ to reduce voltage stress on the series pass element. The power circuit includes, among other structures, an input capacitor power control circuit that connects to the input capacitor $C_{in}$ to readily transfer energy to the input capacitor $C_{in}$ as needed so as to maintain a low voltage stress across the series pass element.

It will be appreciated by persons skilled in the art that numerous variations and/or modifications may be made to the invention as shown in the specific embodiments without departing from the scope of the invention as defined in the claims. The described embodiments of the invention should therefore be considered in all respects as illustrative, not restrictive.

For example, the various controllers in the power circuits in the above embodiments can be implemented using one or more controller. The controller may be formed by one or more of: CPU, MCU, controllers, logic circuits, Raspberry Pi chip, etc. The controller may also include components necessary to receive, store, and execute appropriate computer instructions, commands, or codes. These components may include one or more of a volatile memory unit (such as RAM, DRAM, SRAM), a non-volatile unit (such as ROM, PROM, EPROM, EEPROM, FRAM, MRAM, FLASH, SSD, NAND, and NVDIMM), or any of their combinations. The series pass element in the invention can be implemented using different transistors, not limited to bipolar junction transistors. The construction of the control circuit, in particular the voltage control circuit and the current control circuit, for controlling operation of the series pass element can be different, yet still achieves the function as provided in the above embodiments. The power converter circuit can be implemented with circuit structure suitable to convert and regulate power. The power converter circuit may be a switched power converter with any number of power switches. The operation such as duty cycle, on/off, switching frequency, switching pattern of these switches is controlled by a controller. The input capacitor power control circuit can be implemented with any circuit structure suitable to provide power to the input capacitor. The power source of the input capacitor power control circuit can be other external power source. The voltage threshold can be predetermined, fixed, or adjustable during operation. The input capacitor power control circuit can enable unidirectional power flow or bi-directional power flow. The power source for the input capacitor power control circuit can be any energy storage element.

The invention claimed is:

1. A power circuit for regulating power transfer, the power circuit comprising:
   a power converter circuit arranged to be connected between a power supply and a load to regulate power transfer therebetween, the power converter circuit having an input and an output;
   an input capacitor connected across the input of the power converter circuit;
   a series pass element arranged to be connected between the power supply and the input capacitor; and
   a control circuit, operably connected with the series pass element and the power converter circuit, for controlling operation of the series pass element,
   wherein the power circuit further comprises an input capacitor power control circuit operably connected with the input capacitor, the input capacitor power control circuit is arranged to provide power to the input capacitor to facilitate charging of the input capacitor when a voltage across the series pass element is detected to be above a voltage threshold as a result of an increase in a voltage of the power supply.

2. The power circuit of claim 1, wherein the charging of the input capacitor increases the voltage across the input capacitor and reduces the voltage across the series pass element.

3. The power circuit of claim 2, further comprising a voltage control circuit for detecting a voltage across the series pass element and for comparing the detected voltage with the voltage threshold.

4. The power circuit of claim 3, wherein the voltage control circuit is part of the control circuit.

5. The power circuit of claim 4, wherein the power converter circuit comprises one or more power switches; and wherein the voltage control circuit is further arranged to control operation of the one or more power switches based on the comparison.

6. The power circuit of claim 5, wherein the control circuit further comprises:
   a current control circuit connected between the series pass element and the power converter circuit, the current control circuit is arranged to detect an output of the power converter circuit or an operation parameter of the power converter circuit and, based on the detection, control a current supplied to the series pass element.

7. The power circuit of claim 1, wherein the input capacitor power control circuit is a bi-directional circuit, which is further operable to discharge the input capacitor.

8. The power circuit of claim 1, wherein the input capacitor power control circuit comprises a supplementary power converter circuit operably connected with a power source.

9. The power circuit of claim 8, wherein the supplementary power converter circuit comprises one or more power switches.

10. The power circuit of claim 8, wherein the power source is the output of the power converter circuit.

11. The power circuit of claim 8, wherein the power source comprises a capacitor.

12. The power circuit of claim 1, wherein the voltage threshold is predetermined.

13. The power circuit of claim 1, wherein the voltage threshold is dynamically adjustable.

14. The power circuit of claim 1, wherein the series pass element comprises a transistor.

15. The power circuit of claim 14, wherein the control circuit is arranged to control the transistor to operate in a linear region.

16. The power circuit of claim 1, wherein the input capacitor and the series pass element forms an input filter for the power converter circuit.

17. The power circuit of claim 1, wherein the input capacitor power control circuit is arranged to provide power to the input capacitor to facilitate charging of the input capacitor until a voltage across the input capacitor substantially equals to a difference between the a voltage of the power supply and the voltage threshold.

18. A method for operating the power circuit of claim 3, comprising:
   detecting a voltage across the series pass element;
   determining whether the detected voltage is above a voltage threshold; and
   providing power to the input capacitor to charge the input capacitor when the detected voltage is determined to be above the voltage threshold.

19. The method of claim 18, wherein the step of providing power to the input capacitor stops when a voltage across the input capacitor substantially equals to a difference between the voltage of the power supply and the voltage threshold.

20. An electrical device comprising the power circuit of claim 1.

* * * * *